United States Patent
Kienzle et al.

(10) Patent No.: US 6,946,657 B2
(45) Date of Patent: Sep. 20, 2005

(54) ELECTRON MICROSCOPY SYSTEM

(75) Inventors: Oliver Kienzle, Aalen (DE); Rainer Knippelmeyer, Aalen (DE); Heiko Müller, Heidelberg (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 67 days.

(21) Appl. No.: 10/631,748

(22) Filed: Aug. 1, 2003

(65) Prior Publication Data

US 2004/0108457 A1 Jun. 10, 2004

(30) Foreign Application Priority Data

Aug. 2, 2002 (DE) .......................................... 102 35 456

(51) Int. Cl.[7] .............................................. H01J 37/256
(52) U.S. Cl. ...................................... 250/310; 250/305
(58) Field of Search ................................. 250/310, 305

(56) References Cited

U.S. PATENT DOCUMENTS

| | | |
|---|---|---|
| 4,740,704 A | 4/1988 | Rose et al. |
| 6,265,719 B1 * | 7/2001 | Yamazaki et al. .......... 250/310 |
| 6,310,341 B1 * | 10/2001 | Todokoro et al. ........... 250/305 |
| 6,563,114 B1 * | 5/2003 | Nagahama et al. ......... 250/310 |
| 2002/0088940 A1 * | 7/2002 | Watanabe et al. .......... 250/310 |
| 2003/0066961 A1 | 4/2003 | Kienzle et al. |

FOREIGN PATENT DOCUMENTS

JP   2001076659   * 3/2001

OTHER PUBLICATIONS

Ludwig Reimer, "Electron Spectrometers and Filter Lenses," Transmission Electron Microscopy, Physics of Image Formation and Microanalysis, 1997, vol. 71, pp. 118–121, Springer Series in Optical Sciences.

* cited by examiner

Primary Examiner—Nikita Wells
Assistant Examiner—James J. Leybourne
(74) Attorney, Agent, or Firm—Jones Day

(57) ABSTRACT

A particle-optical apparatus is disclosed which combines the functions of an energy selector 27 and a beam splitter 21. The particle-optical apparatus is used in an electron microscopy system and serves to separate and superimpose, respectively, beam paths of a primary electron beam 11 and a secondary electron beam 13.

20 Claims, 3 Drawing Sheets

ELECTRON MICROSCOPY SYSTEM

BACKGROUND OF THE INVENTION

1) Field of the Invention

The invention relates to a particle-optical apparatus and, in particular, to an electron microscopy system comprising such a particle-optical apparatus for examining an object.

2) Brief Description of Related Art

In an electron microscopy system, in order to examine an object, a primary electron beam is directed to the object to be examined and secondary electrons emanating from the object are directed as secondary electron beam to a detector and detected there. An image of the object under examination can be generated from an intensity of the detected secondary electrons.

In the present application, the term "secondary electrons" embraces, among others, also mirror electrons which are primary electrons reflected at the object which do not fully reach the surface of the object, as well as backscattering electrons which are electrons emitted from the surface of the object and have substantially the same kinetic energy as the primary electrons directed to the object, as well as secondary electrons in a narrower sense, that is, electrons emitted from the object which have a lower kinetic energy than the primary electrons directed to the object.

In electron microscopy systems, there is a need to select both the electrons of the primary electron beam and the electrons of the secondary electron beam in respect of their energy and to shape the electrons contained in the respective beam in respect of their energy spectrum and, in particular, to limit the same to a selectable energy range.

Moreover, there is a need to separate a beam path of the primary electron beam from the beam path of the secondary electron beam in order to be able to manipulate the beams as far as possible independent from each other. A possible manipulation may also comprise the above-mentioned energy selection.

SUMMARY OF THE INVENTION

Accordingly, it is an object of the present invention to provide a particle-optical apparatus which provides the functionalities of a beam splitter in simplified manner.

Moreover, it is an object of the present invention to provide an electron microscopy system which provides the functionalities of a beam splitter.

Moreover, it is an object of the present invention to provide the particle-optical apparatus and electron microscopy system further having the functionality of an energy filter.

According to an embodiment of the invention, a particle-optical apparatus is proposed which comprises: a beam splitter with three terminals; a beam guidance system for the entry and emergence of a first beam and a second beam of charged particles into and from the beam splitter, respectively, one of the three terminals of the beam splitter being provided both for the emergence of the first beam from the beam splitter and the entry of the second beam into the beam splitter; an energy selector which is provided in a beam path of the first or/and the second beam and which transmits charged particles whose kinetic energy is in a predetermined energy range and does substantially not transmit with a sufficient accuracy charged particles whose kinetic energy is outside of the predetermined energy range, the energy selector comprising a magnetic pole arrangement with a plurality of magnetic pole pairs, wherein a magnetic field for deflecting the charged particles transmitted by the energy selector is provided between each magnetic pole pair and wherein the beam splitter comprises at least one magnetic pole pair of the energy selector.

As a result, the functionalities of the beam splitter and the energy selector are provided with a minimum expenditure in particle-optical components.

The particle-optical apparatus is not limited to the use of electrons as charged particles. Rather, ions, myons or other charged particles can also be applied here.

A preferred application of such a particle-optical apparatus is, however, in the field of electron microscopy.

According to a further embodiment, a beam splitter comprises at least one magnetic pole pair of the energy selector, and an angle between a direction of the primary electron beam prior to its entry into the beam splitter and after its emission from the electron source, respectively, and a direction of the primary electron when emerging from the beam splitter is smaller than 90°, in particular, smaller than 80° and, further preferred, smaller than 60°.

Here, too, the combination of the functionalities of the energy selector and the beam splitter has great advantages not only in so far as components can be eliminated but also in so far as the lengths of the beam paths both of the primary electron beam and the secondary electron beam can be shortened. Such a shortening is desirable in order to improve the imaging properties of the electron microscopy system, because they deteriorate with increasing length of the beam path due to the Coulombian repulsion between the electrons of the respective beam.

As compared to known deflection angles of the primary electron beam in the splitter known from conventional electron microscopy systems, the reduction of this angle to the aforesaid preferred angle ranges in combination with the energy selector has the following advantages: the magnetic pole arrangement of the energy selector is configured to provide, with the magnetic fields formed between the respective magnetic pole pairs, a particularly high energy dispersion for the beam traversing the energy selector. This maximum energy dispersion, which is desirable for the beam traversing the energy selector is, however, undesirable for the other beam to be superimposed on said beam by means of the splitter as far as a, if possible, independent superposition of the two beams is concerned.

Accordingly, the present invention is based on the concept to reduce the dispersion for the other beam in that the deflection angle for this other beam is reduced in the beam splitter. Accordingly, the beam guiding arrangement is configured to enclose the primary electron beam in the beam splitter at the aforesaid smaller angles.

In order to provide an adjustment of the primary electron energy over a relatively large energy range, the beam guiding arrangement comprises, according to a further embodiment of the invention, two beam deflectors disposed spaced apart from each other in the beam path of the primary electron beam, each of which provides an adjustable deflection angle of the primary electron beam. As a result, in the beam path of the primary electron beam, there are two degrees of freedom provided for supplying or injecting the primary electron beam to the beam splitter. On the one hand, an angle at which the primary electron beam is injected to the beam splitter can be changed and, on the other hand, a position at which the primary electron beam enters the beam splitter can be adjusted substantially independently thereof.

To this end, preferably a controller is provided which adjusts both the kinetic energy of the primary electron beam and the angle and position of the entry of the primary electron beam into the beam splitter.

According to a further embodiment of the invention, again in order to adjust the energy of the primary electron beam over relatively large ranges, a quadrupole lens is disposed in the beam guiding arrangement in upstream of the beam splitter, wherein the quadrupole strength of the quadrupole lens is adjustable.

The effect which the magnetic field formed between the magnetic pole pairs of the beam splitter has on the primary electron beam comprises an effect of a quadrupole lens which cannot easily be compensated to zero, especially at varying primary electron energies. Accordingly, the separate quadrupole lens with adjustable quadrupole strength is additionally provided in order to compensate for the quadrupole effect of the beam splitter.

Here, too, it is advantageous for the quadrupole strength to be adjusted by a controller dependent upon the primary electron energy.

According to a still further embodiment of the invention, an electron microscope system is provided which comprises the energy selector in the beam path of the primary electron beam so that the object can be irradiated with substantially monochromatic primary electrons or primary electrons with a kinetic energy of a relatively small energy range. Here, too, the beam splitter comprises a magnetic pole pair of the energy selector in order to separate the primary electron beam from the secondary electron beam.

The above-described concepts of electron microscopy systems can be applied to different types of electron microscopes. These are, on the one hand, electron microscopes wherein the primary electron beam is a probe-forming beam which is finely focused on the object at predetermined positions, and a secondary electron intensity is integrally detected, i.e., not in a position-resolved manner. The position resolution of the image is obtained on account of the knowledge of the position at which the probe-forming primary electron beam is focused on the object. These microscope types are known in the field as SEM (electron microscopes). On the other hand, these types of microscopes comprise electron microscopes with a position-sensitive detector on which an extended region of the object is imaged in position-preserving manner. This region is substantially uniformly illuminated by the primary electron beam. These microscope types are known in the field as LEEM (low energy electron microscopes) or SEEM (secondary emission electron microscopes).

BRIEF DESCRIPTION OF THE DRAWINGS

Embodiments of the invention are explained in further detail below with reference to Figures, wherein.

DETAILED DESCRIPTION OF EXEMPLARY EMBODIMENTS

Figure 1:
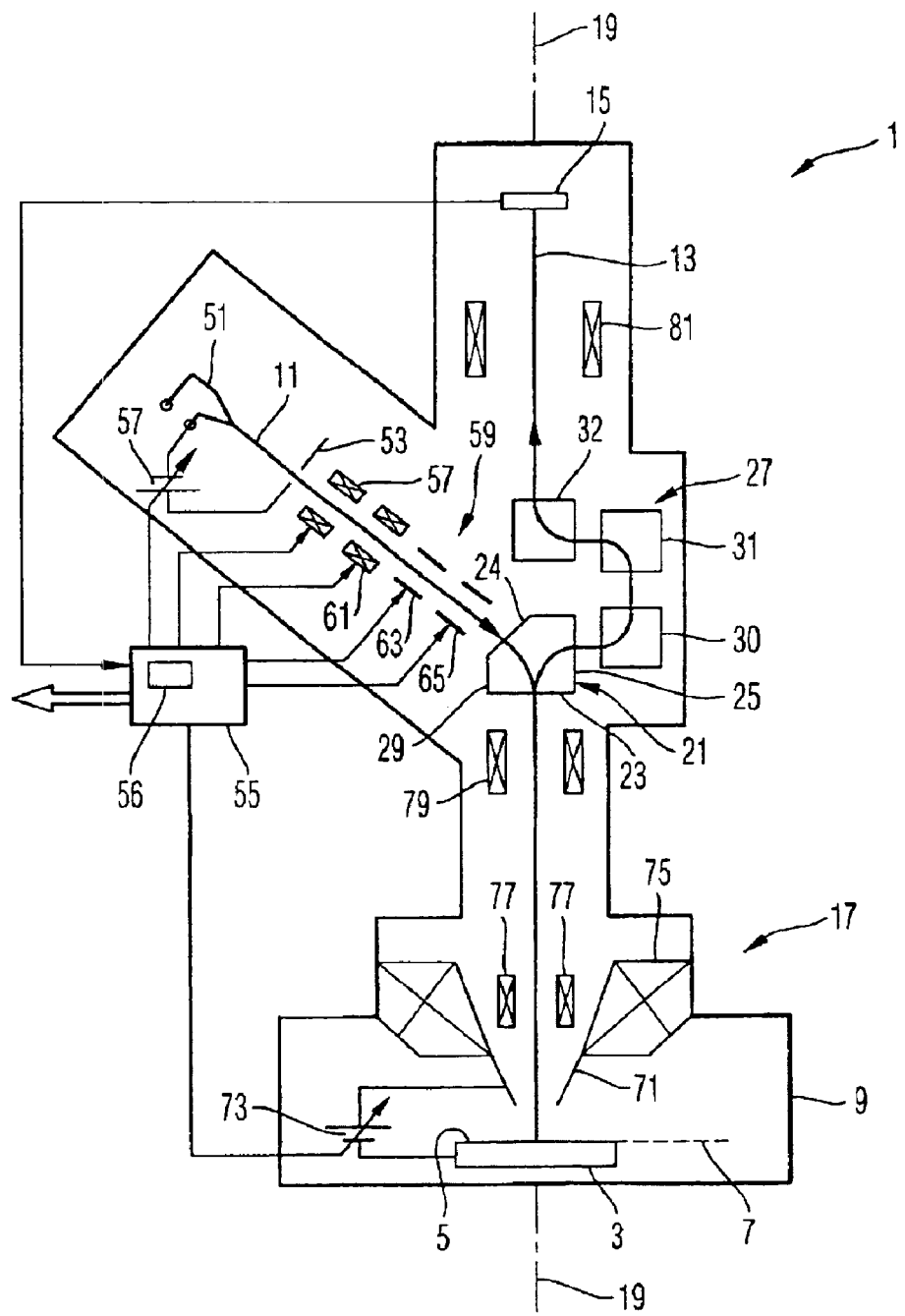
FIG. 1 is a schematic representation of a first embodiment of an electron microscopy system according to the invention.

An electron microscope 1 schematically shown in FIG. 1 serves to generate an electron-microscopic image of an object to be examined, such as a semiconductor wafer 3. A surface 5 of the same is disposed in an object plane 7 of the electron microscope 1 in a sample chamber 9. The electron microscope 1 directs a primary electron beam 11 to the surface 5 of the semiconductor wafer 3, and secondary electrons emanating from a region about the object plane 7 are directed as a secondary electron beam 13 on a detector 15 of the electron microscope 1. The intensities of secondary electrons detected there provide the image information for the image of the object 3 to be generated.

An objective arrangement 17 is provided, on the one hand, for directing the primary electron beam 11 to the surface 5 of the wafer 3 and, on the other hand, for collecting the secondary electrons emerging from the wafer 3 and for shaping the same to the secondary electron beam 13. The objective arrangement 17 is configured substantially rotationally symmetric in respect of an optical axis 19 of the objective arrangement. Moreover, the beam paths of the primary electron beam 11 and the secondary beam 13 are superimposed when passing through the objective arrangement 17. A beam splitter 21 is provided to deflect the beam paths of the primary electron beam 11 and the secondary electron beam 13, which in FIG. 1 are separated from each other above the beam splitter 21, such that they are superimposed in a region between the beam splitter 21 and the object plane 7. The two beams are superimposed here in the sense that the beam cross-sections of the primary electron beam 11 and the secondary electron beam 13 are not necessarily always in exact coincidence in the area of superposition. Rather, a certain displacement of the two beam cross-sections relative to each other is possible. However, the two beams extend in the area of superposition substantially parallel to each other and respectively enter into and emerge from a single terminal 23 of the beam splitter 21.

Moreover, the beam splitter 21 has two further terminals 24 and 25 which differ from each other in that the primary electron beam 11 enters the terminal 24 and the secondary electron beam 13 emerges from the terminal 25.

In the beam path of the secondary electron beam 13, there is provided an energy selector 27 for selecting a kinetic energy of secondary electrons from the secondary electron beam 13. Merely secondary electrons of the selected energy range are allowed to pass through the energy selector 27 and to impinge on the detector 15.

The energy selector 27 is an energy selector of the so-called Ω-type, as it is known, for example, from U.S. Pat. No. 4,740,704, the full disclosure of which is incorporated herein by reference.

Such an energy selector comprises four field regions 29, 30, 31, 32, the outlines of which are schematically shown in FIG. 1 and which are successively traversed by the secondary beam 13. The first field region 29 deflects the secondary electron beam through 90° to the right. The beam then enters the field region 30 which deflect the same through 90° to the left. The beam then enters the field region 31 which deflects the same through a further 90° to the left. Finally, the secondary electron beam 13 enters the field region 32 which again deflects the same through 90° to the right. The magnetic fields strengths prevailing in the field regions 29 to 32 and the spatial extensions of the field regions as well as their position relative to each other are selected such that the secondary electron beam passes through the energy selector 27 substantially straightly, i.e., substantially along the optical axis 19 of the objective arrangement 17.

Figure 3:
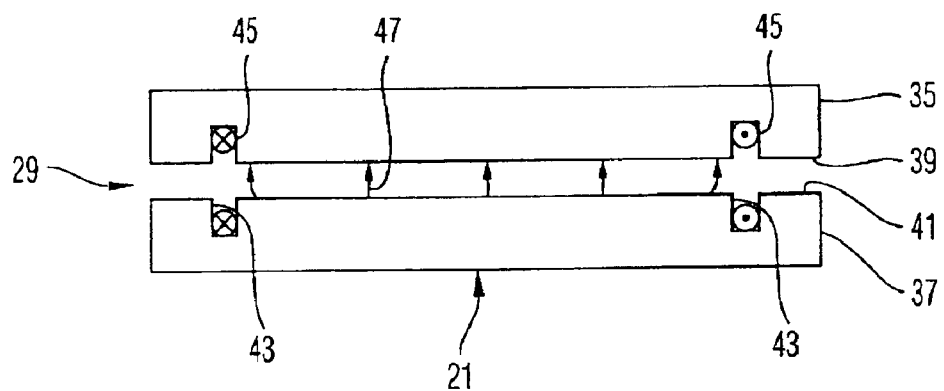
FIG. 3 is a cross-sectional view of the beam splitter of FIG. 2.

The field regions 29 to 32 are each provided by a magnetic pole pair, as it is schematically shown for the field region 29 in the cross-sectional view of FIG. 3. Two magnetic poles 35, 37 have planar surfaces 39 and 41, respectively, which face each other. Closed ring shaped grooves 43 are formed therein into which current conductors 45 are inserted. The grooves 43 and the current conductors 45 inserted therein, respectively, extend along the outline of the field region 29, a current flowing therethrough for a magnetic field to be produced between the spaced apart planar surfaces 39, 41 facing each other. The magnetic field is schematically indicated in the Figure by arrows 47. Between the outlines of the field regions, the field is substantially homogeneous, whereas at the edges of the field region 29 inhomogeneities of the magnetic field occur. The primary beam and the secondary beam, respectively, pass through the gap between the two planar surfaces 39, 41 substantially centrally and are deflected by the magnetic field 47.

The field region 29 of the energy selector 27 provides, apart from the first deflection field for the secondary electron beam 13 in the energy selector 27, also the magnetic field of the beam splitter 21 for superimposing the primary electron beam 11 on the secondary electron beam 13.

The primary electron beam 11 is generated by an electron source 51 which in the embodiment is provided as glow cathode, an anode 53 with an aperture stop for shaping the primary electron beam 11 being disposed opposite thereto. A voltage 57 is applied between the cathode 51 and the anode 53 which is adjustable by a controller 55 in order to set the electrons of the primary electron beam 11 to an adjustable kinetic energy.

After having passed through the aperture stop 53, the primary electron beam 11 is collimated by a collimation lens 57 and travels along an axis 67 (FIG. 2) in a direction which is oriented at an angle of about 45° to the optical axis 19. Between the collimation lens 57 and the beam splitter 21, there is provided a beam guiding arrangement 59 which successively comprises a quadrupole lens 61, a first beam deflector 63 and a second beam deflector 65. The collimation lens 57, the quadrupole lens 61 and the two beam deflectors 63, 65 are controlled by the controller 55 dependent upon the voltage 57 applied between cathode 51 and anode 53, i.e., dependent upon the kinetic energy of the primary electron beam 11.

Figure 2:
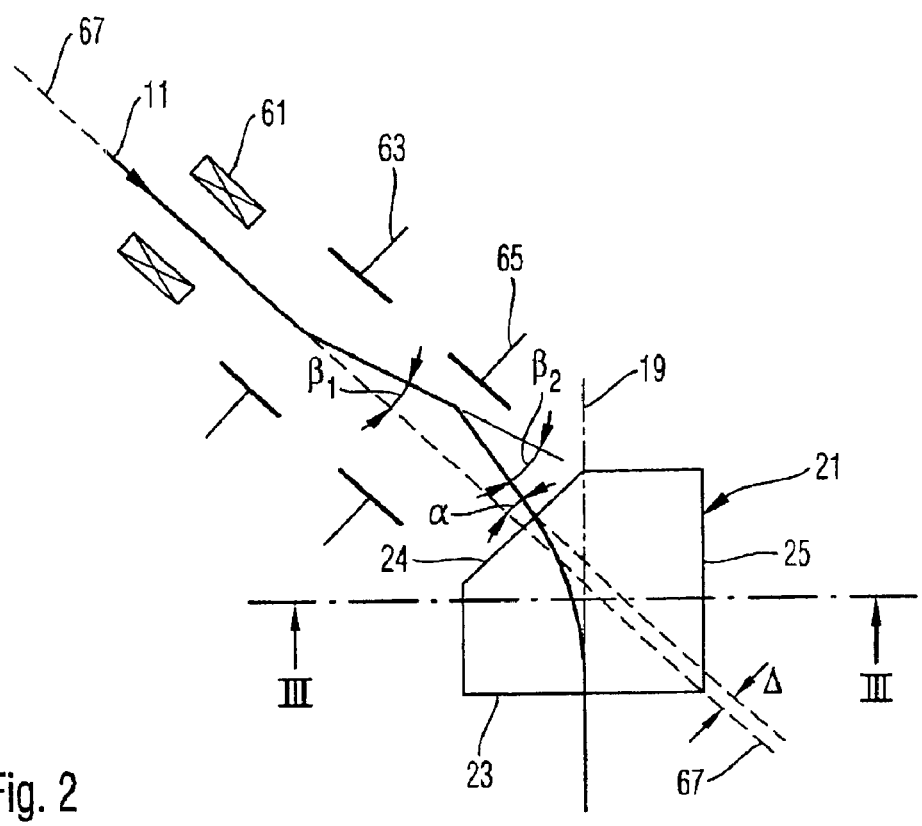
FIG. 2 is a schematic representation of a beam path through a beam splitter in the electron microscopy system of FIG. 1.

The electron microscope 1 is configured such that the magnitudes of the magnetic fields provided in the field regions 29 to 32 of the energy selector 27 are independent from the energy of the primary electron beam 11. Accordingly, the deflection which the primary electron beam 11 is subjected to in the field region 29 of the energy selector 27 is dependent upon the energy of the primary electron beam. However, in order to bring the primary electron beam 11 substantially independent of the energy thereof in the desired superposition with the secondary electron beam 13, the beam deflectors 63, 65 are controlled by the controller 55 to deflect the primary electron beam 11 energy-dependent, as it is schematically illustrated in FIG. 2: Be it assumed that the kinetic energy of the primary electron beam 11 is variable in a range between $E_{min}$=20 keV and $E_{max}$=24 keV, an energy $E_0$=22 keV being about in the middle of the range. At the energy $E_0$, the primary electron beam 11 travels substantially straightly along the axis 67 towards the beam splitter 21 at substantially 45° to the optical axis 19. It enters the beam splitter via the terminal 24 and is deflected by 45° to emerge from the beam splitter 21 via terminal 23 along the optical axis 19.

If the primary electron beam 11 has the higher energy $E_{max}$, the first beam deflector 63 is controlled by the controller such that it deflects the primary electron beam through an angle $\beta_1$ to the left. The primary electron beam 11 then enters the second deflector 65 displaced from the axis 67, the beam deflector then deflecting the primary electron beam 11 through an angle $\beta_2$ to the right. The primary electron beam 11 then enters the terminal 24 of the beam splitter 21 with a displacement $\Delta$ to the left from the axis 67 and at an angle $\alpha$ in respect of the axis 67. The displacement $\Delta$ and the angle $\alpha$ are selected such that the primary electron beam 11 having the higher energy $E_{max}$ is deflected through an angle which is smaller than 45° such that it emerges from the splitter 21 likewise along the optical axis 19.

If the primary electron beam 11 has the lower energy $E_{min}$, the deflectors 63 and 64 are controlled such that it is deflected to the right by the deflector 63 and to the left by the deflector 65 and enters the splitter 24 displaced to the right from the axis 67 and again at an angle to the axis 67 such that also with the lower energy it emerges from the splitter 21 again substantially along the optical axis 19. At energies of the primary electron beam 11 which lie between the values $E_{min}$ and $E_{max}$, the deflectors 63, 65 are correspondingly controlled by the controller 55 with smaller deflection angles $\beta_1$, $\beta_2$.

The deflectors 63, 65 can be provided as electrostatic deflectors or as magnetic deflectors. To provide at least the deflector 65 which is disposed closer to the energy filter 27 and splitter 29, respectively, electrostatically involves the advantage that stray magnetic fields of the deflector 65 do not influence the energy filter 27 and beam splitter 21, respectively.

Since the magnetic field 47 formed between the magnetic poles 35, 37 is inhomogeneous at the edges thereof and the primary electron beam 11 enters the field region 29 at different angles $\alpha$, the field region 29 exerts with its edge fields different quadrupole effects on the primary electron beam 11. In order to compensate for this, the quadrupole lens 61 is provided. It is controlled by the controller 55 dependent upon the energy of the primary electron beam 11 such that the quadrupole effects of the quadrupole lens 61 and the quadrupole effect of the field region 29 substantially neutralize themselves.

For obtaining a higher accuracy it is possible to provide two quadrupole lenses rather than the one quadrupole lenses 61. The controller 45 comprises a memory 56 for adjusting the deflection angles $\beta_1$ and $\beta_2$ and the quadrupole effect of the quadrupole lens 61 and the quadrupole effects of plural quadrupole lenses, respectively. The memory 56 stores for a plurality of energy values of the primary electron beam or for a physical property derived therefrom associated settings of the deflection angles $\beta_1$ and $\beta_2$, or the corresponding derived energizations of the deflectors 63 and 65, and stores the corresponding quadrupole effects or energizations of the quadrupole lens 61 or the plural quadrupol lenses, respectively.

The objective arrangement 17 further comprises an electrode 71 as a further component to which an adjustable voltage 73 is applied relative to the wafer for providing an electric extraction field between the surface 5 of the wafer 3 and the electrode 71 which, on the one hand, accelerates the secondary electrons away from the object plane 7 and, on the other hand, decelerates the electrons of the primary electron beam 11 prior to impinging on the object surface 5.

The extraction field accelerates the secondary electrons to the kinetic energy at which they then enter the energy selector 27. By changing the extraction field, it is thus possible, with a fixed setting of the energy elector 27, to also select the energies of the secondary electrons passing through the energy selector. This applies to the energies of the secondary electrons directly prior to their emergence from the object.

The objective arrangement 17 further comprises a magnetic main coil 75 for generating a magnetic field which contributes essentially to the focusing of the primary electron beam and the secondary electrons, respectively. Deflection coils 77 are disposed within the coil 75 which are capable of deflecting the primary electron beam away from the optical axis 19 in order to scan a larger region of the object surface 7.

Between the objective arrangement 17 and the energy selector 27, there is further provided a field coil 79 before the secondary electron beam 13 enters the energy selector 27, which field coil serves, among others, to adapt the beam path of the secondary electron beam 13 to a setting of the energy selector 27. The energy selector 27 is likewise controllable by the controller 55 to select the energy range which is transmitted by the energy selector 27.

A further field coil 81 is provided between the energy selector 27 and the detector 15.

The electron microscope 1 can be operated as SEM such that the primary electron beam 11 is finely focused by the objective arrangement 17 in the object plane and is deflected by the deflection coils 77 for systematically scanning a region of the object plane 7. Here, the detector is not necessarily a position-sensitive detector. The position resolution of the image is obtained by the knowledge of the positions which the primary electron beam 11 is directed to in the object plane 7. The secondary electron intensities detected in each case are in the image allocated to these positions.

However, it is also possible to operate the electron microscope as LEEM or SEEM. The primary electron beam 11 then illuminates simultaneously a larger region in the object plane 7. The objective arrangement 17 is optimized to the effect that, together with the other components, it forms part of a beam guidance for the secondary electron beam 13 such that substantially the region of the object plane 7 illuminated by the primary electron beam 11 is imaged on a surface region of the detector 15, the detector 15 being then a position-sensitive detector.

Variants of embodiments described with reference to FIGS. 1 to 3 will now be described hereinafter. Components which correspond in structure or/and function to components of FIGS. 1 to 3 are designated by the same reference numbers, however, supplemented by an additional letter for the purpose of distinction. Reference is taken to the entire above description.

Figure 4:
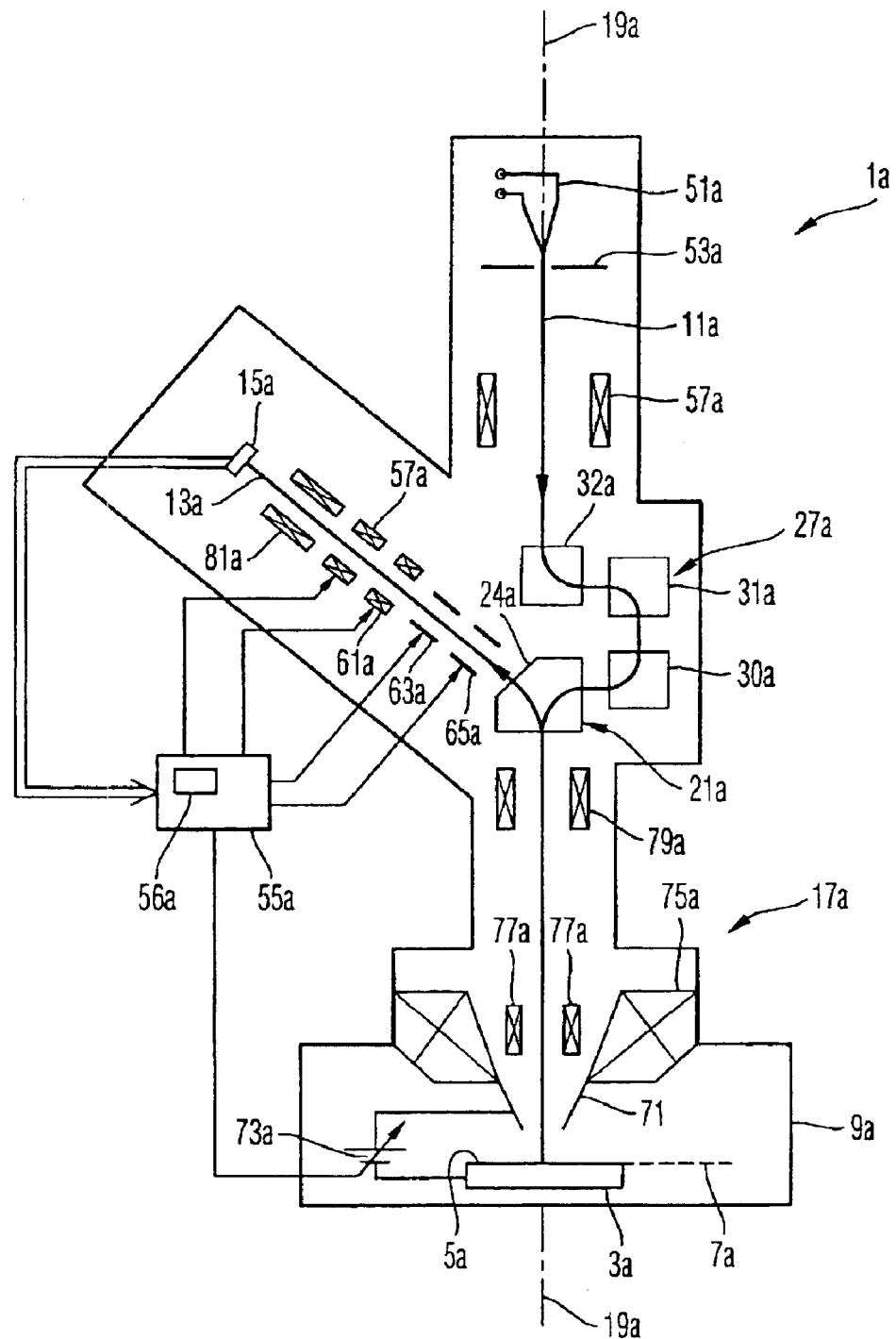
FIG. 4 is a schematic representation of a second embodiment of the electron microscopy system according to the invention.

An electron microscope 1a schematically shown in FIG. 4 comprises an objective arrangement 17a with an optical axis 19a. The objective arrangement 17a comprises for a primary electron beam 11a and a secondary electron beam 13a a focusing magnetic coil 75a, an electrode 71a for forming an extraction field and deflection coils 77a for deflecting the primary electron beam 11a and the secondary electron beam 13a, respectively.

In contrast to the electron microscope of FIG. 1, in the electron microscope 1a of FIG. 4 an energy selector 27a is disposed in the beam path of the primary electron beam 11a and not in the beam path of the secondary electron beam 13a.

By arranging the energy selector 27a in the beam path of the primary electron beam, it is possible to limit the energy spectrum of the primary electrons. One advantage associated therewith resides in that a chromatic aberration of the optical components disposed in the beam path of the primary electron beam, in particular, of the objective arrangement 17a is reduced.

The primary electron beam 11a emitted by the electron source 51a and accelerated by an anode stop 53a travels substantially along the optical axis 19a and, after having passed through a collimation lens 57a, enters a field region 32a of the energy selector 27a. The primary electron beam 11a is deflected by the field region 32a first through 90° to the left, then through 90° to the right by a further field region 31a, through a further 90° to the right by a field region 30a and subsequently again through 90° to the left by a field region 21a so that, after having passed a field lens 79a, it enters the objective arrangement 75a along the optical axis 19a.

The field region 21a of the energy selector 27a likewise serves as beam splitter to separate the beam paths of the primary electron beam 11a and the secondary electron beam 13a which coincide between the splitter 21a and the objective plane 7a. The secondary electron beam 13a emerges from the field region 21a via a terminal 24a, passes through two beam deflectors 65a and 63a, a quadrupole lens 61a and two further lenses 57a and 81a and impinges on the detector 15a. The deflectors 65a and 63a and the quadrupole lens 61a again serve to adapt the image on the detector 15a to specific desired energies of the secondary electron beam 13a in similar fashion as it has already been described with reference to FIG. 2 for the primary electron beam. Accordingly, the controller 55a comprises a memory 56a storing predetermined energy values of the secondary electron beam entering the beam splitter, or values derived therefrom, and corresponding associated values for the energization of deflectors 63a, 63b and of the quadrupole lens 57a.

By appropriately controlling the energy selector 27a, it is then possible with the electron microscope 1a to adjust the kinetic energy of the primary electrons to a desired energy band.

The electron microscope 1a, too, can be used as SEM or as a LEEM (low energy electron microscope) and SEEM, respectively, as it has already been mentioned above in connection with the electron microscope described with reference to FIGS. 1 to 3.

An important aspect is the fact that the energy filter is a group of electron optical elements which is, per se, difficult to adjust correctly. Finding a correct adjustment setting at changing energies of the primary electron beam entering the energy filter is difficult. Therefore, a change of the energy of the primary electrons impinging on the sample 3a is achieved by changing the voltage 73a. Such changing of the voltage 73a changes, however, also the energy of the secondary electron beam entering the beam splitter, and errors and deviations caused thereby are compensated for by the energy-dependent control of the deflectors 63a, 65a and of the quadrupole lens 61a. In this respect the principle of the invention may be also applied to electron microscopy systems having a beam splitter in which a change of energy of the primary electron beam upstream of the beam splitter or of the secondary electron beam downstream of the beam splitter is difficult or not possible with a required accuracy.

In the above-described embodiments, the objective lens arrangement 17 is configured rotationally symmetrically in respect of the optical axis 19, and deflectors 77 are provided to deflect the primary electron beam in the object plane 7 away from this optical axis. However, it is also conceivable to use objective lens arrangements which are not rotationally symmetrically configured. An example of this is a slit lens which comprises a slit elongated transversely to the optical axis for the beam to pass through in order to achieve larger deflections of the primary electron beam. Such a lens is described in the co-pending U.S. patent application Ser. No. 10/185,729 of the applicant, the full disclosure of which is incorporated herein by reference.

In the above-described embodiments, merely two lenses are disposed between the object plane and the energy selector, namely the objective lens 17 and the field coil 79. However, it is also possible to provide here further lenses in order to improve the one or other optical property of the system as a whole.

In the above-described embodiments, merely one primary electron beam is directed to the object and merely one secondary electron beam is directed away from the object to the detector. However, it is also possible to use the above-described particle optical components in an electron microscopy system which directs a plurality of primary electron beams separated from each other to the object or/and which directs a plurality of secondary electron beams separated from each other from the object to one or more detectors. In this respect, it is possible that one or more of the particle-optical components provided in the beam paths are each realized as single component providing a magnetic or electric field, the plurality of beams then entering the thus provided field and are commonly shaped and deflected, respectively, in the same. It is, for example, possible to direct a plurality of primary electron beams through an objective arrangement with a coherent bore towards the object and to also focus the same on the object.

The present invention has been described by way of exemplary embodiments to which it is not limited. Variations and modification will occur to those skilled in the art without and departing from the scope of the present invention as recited in the appended claims.

What is claimed:

1. An electron microscopy system for inspecting an object positionable in an object plane, comprising:
    a beam splitter for separating a beam path of a primary electron beam from a beam path of a secondary electron beam,
    an electron source for generating the primary electron beam, and
    an objective lens disposed in the beam path of the primary electron beam downstream of the beam splitter for guiding the primary electron beam to the object plane and for guiding secondary electrons emanating from a region around the object plane towards the beam splitter, the secondary electrons forming the secondary electron beam,
    wherein at least one of at least one beam deflector and at least one quadrupole lens is disposed in the beam path of the secondary electron beam downstream of the beam splitter, and
    wherein the electron microscopy system further comprises and energy adjusting apparatus for adjusting a kinetic energy of the electrons of the secondary electron beam entering the beam splitter, and a controller for controlling the energy adjusting apparatus, wherein the controller further controls said at least one of the at least one beam deflector and the at least one quadrupole lens in dependence of the adjusted energy.

2. The electron microscopy system according to claim 1, wherein the controller comprises a memory for storing corresponding values representing the kinetic energy of the secondary electron beam entering the beam splitter, and representing settings of the at least one beam deflector and the quadrupole lens, respectively.

3. An electron microscopy system for inspecting an object positionable in an object plane, comprising:
    a beam splitter for separating a beam path of a primary electron beam from a beam path of a secondary electron beam,
    an electron source for generating the primary electron beam,
    an objective lens disposed in the beam path of the primary electron beam downstream of the beam splitter for guiding the primary electron beam to the object plane and for guiding secondary electrons emanating from a region around the object plane towards the beam splitter, the secondary electrons forming the secondary electron beam,
    wherein at least one of at least one beam deflector and at least one quadrupole lens is disposed in the beam path of the secondary electron beam downstream of the beam splitter, and
    wherein the electron microscopy system further comprises an energy selector which is provided in the beam path of the primary electron beam between the electron source and the beam splitter and which transmits charged particles of the primary electron beam whose kinetic energy is in a predetermined energy range and does substantially not transmit charged particles whose kinetic energy is outside of the predetermined energy range, wherein the energy selector comprises a magnetic pole arrangement with a plurality of magnetic pole pairs, and wherein a magnetic field for deflecting the charged particles transmitted by the energy selector is provided between each magnetic pole pair, and wherein the beam splitter comprises at least one magnetic pole pair of the energy selector.

4. The electron microscopy system according to claim 1, wherein the objective lens focuses the primary electron beam to provide a focused primary electron beam in the object plane.

5. The electron microscopy system according to claim 1, wherein the objective lens forms part of an imaging beam path with which the object plane is imaged substantially sharply on a secondary electron detector by the secondary electron beam.

6. An electron microscopy system for inspecting an object which is positionable in an object plane, comprising:
    a beam splitter for separating a beam path of a primary electron beam from a beam path of a secondary electron beam,
    an electron source for generating the primary electron beam,
    a beam guiding system for guiding the primary electron beam from the electron source to the beam splitter,
    an objective lens disposed in the beam path of the primary electron beam downstream of the beam splitter for guiding the primary electron beam to the object plane and for guiding secondary electrons emanating from a region about the object plane towards the beam splitter, the secondary electrons forming the secondary electron beam, and
    an energy selector which is provided in the beam path of the secondary electron beam and which transmits charged particles of the secondary electron beam whose kinetic energy is in a predetermined energy range and does substantially not transmit charged particles whose kinetic energy is outside of the predetermined energy range, wherein the energy selector comprises a magnetic pole arrangement with a plurality of magnetic pole pairs, and wherein a magnetic field for deflecting the charged particles transmitted by the energy selector is provided between each magnetic pole pair, wherein the beam splitter comprises at least one magnetic pole pair of the energy selector, and wherein the beam guiding system comprises in the beam path of the primary electron beam two spaced apart beam deflectors for generating adjustable deflection angles of the primary electron beam, wherein the electron microscopy system is a scanning electron microscopy system configured such that the objective lens focuses the primary electron beam to provide a focused primary electron beam in the object plane, the scanning electron microscopy system comprising a deflection device for systematically scanning the focused primary electron beam across a portion of the object plane, and wherein the electron microscopy system further comprises an energy adjusting apparatus for adjusting a kinetic energy of the electrons of the primary electron beam entering the beam splitter and a controller for controlling the energy adjusting apparatus, the controller further controlling the two beam deflectors for adjusting the deflection angles in dependence of the adjusted energy.

7. The electron microscopy system according to claim 6, wherein the controller comprises a memory for storing corresponding values representing the kinetic energy of the primary electron beam entering the beam splitter, and representing settings of the two beam deflectors.

8. The electron microscopy system according to claim 6, wherein the objective lens forms part of an imaging beam path with which the object plane is imaged substantially sharply on a secondary electron detector by the secondary electron beam.

9. An electron microscopy system for inspecting an object which is positionable in an object plane, comprising:
a beam splitter for separating a beam path of a primary electron beam from a beam path of a secondary electron beam,
an electron source for generating the primary electron beam,
a beam guiding system for guiding the primary electron beam from the electron source to the beam splitter,
an objective lens disposed in the beam path of the primary electron beam downstream of the beam splitter for guiding the primary electron beam to the object plane and for guiding secondary electrons emanating from a region about the object plane towards the beam splitter, the secondary electrons forming the secondary electron beam, and
an energy selector which is provided in the beam path of the secondary electron beam and which transmits charged particles of the secondary electron beam whose kinetic energy is in a predetermined energy range and does substantially not transmit charged particles whose kinetic energy is outside of the predetermined energy range, wherein the energy selector comprises a magnetic pole arrangement with a plurality of magnetic pole pairs, and wherein a magnetic field for deflecting the charged particles transmitted by the energy selector is provided between each magnetic pole pair, wherein the beam splitter comprises at least one magnetic pole pair of the energy selector, and wherein the beam guiding system comprises a quadrupole lens with adjustable quadrupole strength arranged in the beam path of the primary electron beam.

10. The electron microscopy system according to claim 9, further comprising an energy adjusting apparatus for adjusting a kinetic energy of the electrons of the primary electron beam entering the beam splitter and a controller for controlling the energy adjusting apparatus, wherein the controller further controls the quadrupole lens for adjusting the quadrupole strength in dependence of the adjusted energy.

11. The electron microscopy system according to claim 10, wherein the controller comprises a memory for storing corresponding values representing the kinetic energy of the primary electron beam entering the beam splitter, and representing settings of the two beam deflectors.

12. The electron microscopy system according to claim 9, wherein the objective lens focuses the primary electron beam to provide a focused primary electron beam in the object plane.

13. The electron microscopy system according to claim 9, wherein the objective lens forms part of an imaging beam path with which the object plane is imaged substantially sharply on a secondary electron detector by the secondary electron beam.

14. An electron microscopy system for inspecting an object which is positionable in an object plane, comprising:
a beam splitter for separating a beam path of a primary electron beam from a beam path of a secondary electron beam,
an electron source for generating the primary electron beam,
a beam guiding system for guiding the primary electron beam from the electron source to the beam splitter,
an objective lens disposed in the beam path of the primary electron beam downstream of the beam splitter for guiding the primary electron beam to the object plane and for guiding secondary electrons emanating from a region about the object plane towards the beam splitter, the secondary electrons forming the secondary electron beam, and
an energy selector which is provided in the beam path of the secondary electron beam and which transmits charged particles of the secondary electron beam whose kinetic energy is in a predetermined energy range and does substantially not transmit charged particles whose kinetic energy is outside of the predetermined energy range, wherein the energy selector comprises a magnetic pole arrangement with a plurality of magnetic pole pairs, and wherein a magnetic field for deflecting the charged particles transmitted by the energy selector is provided between each magnetic pole pair, wherein the beam splitter comprises at least one magnetic pole pair of the energy selector, and in that an angle between a direction of the primary electron beam after having been emitted by the electron source and a direction of the primary electron beam when emerging from the beam splitter is smaller than 80°.

15. The electron microscopy system according to claim 14, wherein said angle between a direction of the primary electron beam after having been emitted by the electron source and a direction of the primary electron beam when emerging from the beam splitter is smaller than 60°.

16. The electron microscopy system according to claim 1, further comprising an energy selector which is provided in the beam path of the primary electron beam between the electron source and the beam splitter and which transmits charged particles of the primary electron beam whose kinetic energy is in a predetermined energy range and does substantially not transmit charged particles whose kinetic energy is outside of the predetermined energy range, wherein the energy selector comprises a magnetic pole arrangement with a plurality of magnetic pole pairs, and wherein a magnetic field for deflecting the charged particles transmitted by the energy selector is provided between each magnetic pole pair, and wherein the beam splitter comprises at least one magnetic pole pair of the energy selector.

17. The electron microscopy system according to claim 3, wherein the objective lens focuses the primary electron beam to provide a focused primary electron beam in the object plane.

18. The electron microscopy system according to claim 3, wherein the objective lens forms part of an imaging beam path with which the object plane is imaged substantially sharply on a secondary electron detector by the secondary electron beam.

19. The electron microscopy system of claim 9, wherein the beam guiding system further comprises in the beam path of the primary electron beam two spaced apart beam deflectors or generating adjustable deflection angles of the primary electron beam.

20. The electron microscopy system of claim 19, wherein the controller is further adapted to control the two beam deflectors for adjusting the deflection angles in dependence of the adjusted energy.

* * * * *